United States Patent

Mead et al.

Patent Number: 6,097,432
Date of Patent: *Aug. 1, 2000

[54] SENSE AMPLIFIER FOR HIGH-DENSITY IMAGING ARRAY

[75] Inventors: Carver A. Mead; Tobias Delbruck, both of Pasadena, Calif.

[73] Assignee: Synaptics, Inc., San Jose, Calif.

[*] Notice: This patent is subject to a terminal disclaimer.

[21] Appl. No.: 08/855,938

[22] Filed: May 14, 1997

Related U.S. Application Data

[62] Division of application No. 08/679,686, Jul. 11, 1996, Pat. No. 5,844,265.

[51] Int. Cl.[7] .............................. H04N 3/14; H04N 5/335; G01R 19/00; H01L 31/062
[52] U.S. Cl. .............................. 348/302; 327/52; 257/292
[58] Field of Search ......................... 348/302; 327/51–52; 250/208.1; 330/277, 279, 285, 307, 300; 257/291, 292, 443

[56] References Cited

U.S. PATENT DOCUMENTS

| | | | |
|---|---|---|---|
| Re. 34,309 | 7/1993 | Tanaka et al. | 358/213.31 |
| 4,634,886 | 1/1987 | Hatanaka et al. | 250/578 |
| 4,652,766 | 3/1987 | Wang et al. | 250/578 |
| 4,682,236 | 7/1987 | Wang et al. | 358/213.26 |
| 4,683,580 | 7/1987 | Matsunaga | 377/60 |
| 4,734,776 | 3/1988 | Wang et al. | 358/213.31 |
| 4,794,443 | 12/1988 | Tanaka et al. | 357/43 |
| 4,809,075 | 2/1989 | Akimoto et al. | 358/213.18 |
| 4,831,454 | 5/1989 | Tanaka et al. | 358/213.31 |
| 4,835,404 | 5/1989 | Sugawa et al. | 250/578 |
| 4,902,886 | 2/1990 | Smisko | 250/214 R |
| 4,962,412 | 10/1990 | Shinohara et al. | 357/30 |
| 5,060,042 | 10/1991 | Shinohara et al. | 357/30 |
| 5,097,305 | 3/1992 | Mead et al. | 35/30 |
| 5,101,252 | 3/1992 | Matsumoto | 357/30 |
| 5,113,254 | 5/1992 | Kanno et al. | 358/98 |
| 5,216,510 | 6/1993 | Amingual et al. | 358/213.15 |
| 5,245,201 | 9/1993 | Kozuka et al. | 257/53 |
| 5,260,592 | 11/1993 | Mead et al. | 257/291 |
| 5,283,428 | 2/1994 | Morishita et al. | 250/214.1 |
| 5,324,958 | 6/1994 | Mead et al. | |
| 5,335,008 | 8/1994 | Hamasaki | 348/301 |
| 5,335,088 | 8/1994 | Mamashi et al. | |
| 5,345,266 | 9/1994 | Denyer | 348/300 |
| 5,386,108 | 1/1995 | Arikawa et al. | 250/208.1 |
| 5,401,952 | 3/1995 | Sugawa | 250/208.1 |
| 5,512,750 | 4/1996 | Yanka et al. | 250/338.4 |
| 5,557,121 | 9/1996 | Kozuka et al. | 257/292 |
| 5,591,960 | 1/1997 | Furukawa et al. | 250/208.1 |
| 5,598,023 | 1/1997 | Matsumoto | 257/462 |

FOREIGN PATENT DOCUMENTS

| | | | |
|---|---|---|---|
| 91/04633 | 4/1991 | WIPO | H04N 3/15 |

*Primary Examiner*—Wendy Garber
*Assistant Examiner*—Alicia M. Harrington
*Attorney, Agent, or Firm*—Sierra Patent Group, Ltd.

[57] ABSTRACT

A sense amplifier comprises an input node and an output node. An input transistor has a gate connected to the input node, a source connected to a first supply voltage rail, and a drain. A cascode transistor has a gate connected to a cascode node, a source connected to the drain of the input transistor, and a drain connected to the output node. A load transistor has a gate connected to a bias node, a drain connected to the output node, and a source connected to a second supply voltage rail. The gates of the cascode transistor and the load transistor are biased such that the input transistor and the cascode transistor are operated near their threshold and the load transistor is operated above threshold. In a presently preferred embodiment of the present invention, the input transistor and the cascode transistor of the sense amplifier are wide and short, such that they operate in below threshold, whereas the load transistor is made long and relatively narrow, so that it operates above threshold.

10 Claims, 8 Drawing Sheets

FIG. 9 though a patent application might look extensive.

SENSE AMPLIFIER FOR HIGH-DENSITY IMAGING ARRAY

RELATED U.S. APPLICATION DATA

This is a divisional of U.S. patent application Ser. No. 08/679,686, filed Jul. 11, 1996 now U.S. Pat. No. 5,844,265.

BACKGROUND OF THE INVENTION

1. Field of the Invention

The present invention relates to integrated circuit technology and imaging array technology and amplifier technology for use in integrated circuit applications. More particularly, the present invention relates to a high density imaging array integrated circuit including a sense amplifier for use in such an array.

2. The Prior Art

Sense amplifier circuits in general are known in the prior art. Sense amplifier circuits for use in imaging arrays are also known in the prior art.

A high-density photosensing imager may be realized by an array of bipolar transistors with bases capacitively coupled to sense lines, as previously disclosed by Mead et al. in U.S. Pat. Nos. 5,097,305, 5,260,592, and 5,324,958. In such an imager it is necessary to construct a sense amplifier that has a gain of 1000 or greater. It would be advantageous for such a sense amplifier to fit into a width of one pixel in the imager array (6 microns in a 1 micron process) so as to be able to provide a compact, efficient photosensing imager system. It is desirable that the sense amplifier have low noise, low power dissipation, and a compressive input-output characteristic such that it will decrease its gain gradually at large inputs rather than clip abruptly. Traditional amplifier designs either have too much noise or cannot be made to fit in the width available.

It is therefore an object of the present invention to provide a sense amplifier which overcomes one or more shortcomings of the prior art.

Yet another object of the present invention is to provide a sense amplifier which can fit into the width of a single pixel in a photosensor array.

It is a further object of the present invention to provide a sense amplifier having low noise, low power dissipation, and a compressive input-output characteristic such that it will decrease its gain gradually at large inputs rather than clip abruptly.

Yet a further object of the present invention is to provide an integrated photosensing imager system including a sense amplifier which can fit into the width of a single pixel in a photosensor array.

Another object of the present invention is to provide an integrated photosensing imager system including a sense amplifier having low noise, low power dissipation, and a compressive input-output characteristic such that it will decrease its gain gradually at large inputs rather than clip abruptly and which can fit into the width of a single pixel in a photosensor array.

BRIEF DESCRIPTION OF THE INVENTION

A sense amplifier according to a presently preferred embodiment of the invention comprises an input node and an output node. An input transistor has a gate connected to the input node, a source connected to a first supply voltage rail, and a drain. A cascode transistor has a gate connected to a cascode node, a source connected to the drain of the input transistor, and a drain connected to the output node. A load transistor has a gate connected to a bias node, a drain connected to the output node, and a source connected to a second supply voltage rail.

The gates of the cascode transistor and the load transistor are biased such that the input transistor and the cascode transistor are operated in weak inversion and the load transistor is operated in strong inversion. In a presently preferred embodiment of the present invention, the input transistor and the cascode transistor of the sense amplifier are wide and short, such that they operate in weak inversion (near the threshold voltage of the transistor), whereas the load transistor is made long and relatively narrow, so that it operates in strong inversion (well above the threshold voltage of the transistor).

According to another aspect of the present invention, a plurality of sense amplifiers according to the present invention are integrated along with a photosensor array comprising single transistor sensing elements arranged in a matrix of desired size. Each sense amplifier occupies a width equal to or less than the width of a single column in the photosensor array.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
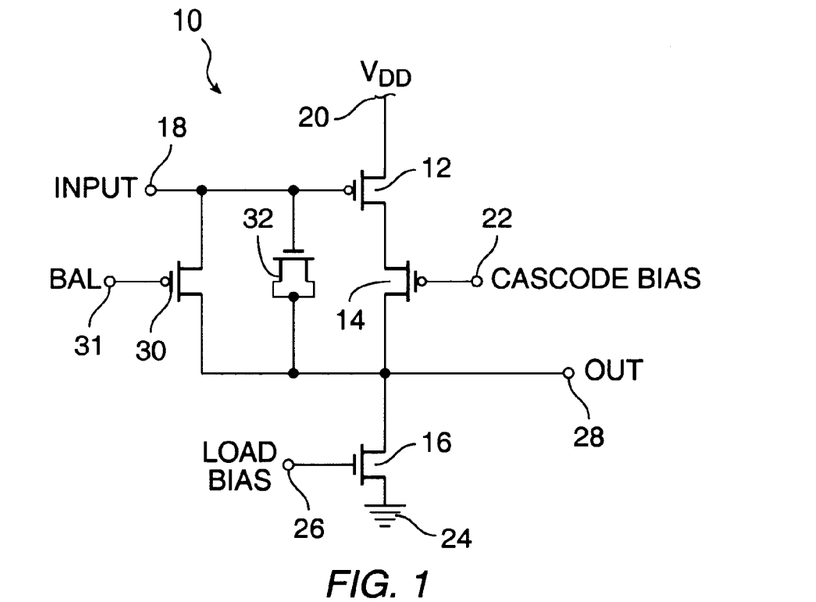
FIG. 1 is a schematic diagram of a presently preferred embodiment of the sense amplifier of the present invention.

The present invention teaches an amplifier design that achieves low noise, high gain, low power dissipation, and a compressive input-output characteristic, all in a narrow width. The schematic diagram of such a sense amplifier 10 is shown in FIG. 1. Sense amplifier 10 comprises input transistor 12, cascode transistor 14, and load transistor 16. In the embodiment of FIG. 1, input transistor 12 is a P-Channel MOS transistor, cascode transistor 14 is a P-Channel MOS transistor, and load transistor 16 is an N-Channel MOS transistor.

Input transistor 12 has its gate connected to input line 18, its source connected to Vdd rail 20, and its drain connected to the source of cascode transistor 14. The gate of cascode transistor 14 is connected to a cascode line 22. Cascode line 22 is connected to a voltage source supplying a cascode bias voltage slightly above the threshold voltage of the transistor.

The drain of cascode transistor is connected to the drain of load transistor 16. The source of load transistor 16 is connected to ground rail 24 and the gate of load transistor 16 is connected to load bias node 26. Load bias node 26 is connected to a bias voltage source supplying a load bias voltage well above the threshold voltage of the transistor. The output node 28 of amplifier 10 is the common connection of the drains of cascode transistor 14 and load transistor 16.

A balance transistor 30, shown as a P-C-Channel MOS transistor, is connected between input line 18 and output node 28, and has its gate connected to a BAL signal node 31. In addition, as presently preferred, a varactor structure 32 may be connected between the input and output of amplifier 10. Use of a varactor structure allows compression of the output signal over a wide dynamic range of input signals.

As known in the art, a varactor structure may comprise a large-area MOS transistor. The gate of the MOS transistor comprises one terminal of the varactor structure and the other terminal of the varactor structure comprises the source and drain of the MOS transistor connected together.

Either an N-channel MOS transistor or a P-channel MOS transistor may be used as the varactor according to the present invention. Because, in the presently illustrated application, a positive charge is to be sensed, if an N-channel MOS transistor is used as the varactor as indicated at reference numeral 32, its gate is connected to the input of sense amplifier 10 and its source and drain are connected to the output of sense amplifier 10. If a P-channel MOS transistor is used as the varactor, its source and drain are connected to the input of sense amplifier 10 and its gate is connected to the output of sense amplifier 10.

If a charge of the opposite sign is to be sensed, those of ordinary skill in the art will realize that the connections to the varactor will be reversed. If an application requires sensing charge of both polarities, two varactors connected in opposite directions may be used.

The key to achieving low noise is to make both the input transistor 12 and the cascode transistor 14 wide and short, such that they operate in weak inversion (near the threshold voltage of the transistor), whereas the load transistor 16 is made long and relatively narrow, so that it operates in strong inversion (well above the threshold voltage of the transistor). In a typical layout of amplifier 10, the w/l ratio of input transistor 12 and cascode transistor 14 will be much greater than the w/l ratio of load transistor 16. For purposes of this disclosure and claims, the w/l ratio of input transistor 12 and cascode transistor 14 is much greater than the w/l ratio of load transistor 16 when it is at least 10 times the w/l ratio of the load transistor. Those of ordinary skill in the art will readily be able to scale these dimensions for arrays of other sizes.

The reason that this design is optimal can be seen as follows: The mean squared voltage noise referred to the gate of the input transistor is the well-known expression:

$$v^2 = \frac{kT}{g_m}$$

where gm is the transconductance of the input stage operating with bias current I, and kT is the thermal voltage. In weak inversion $$g_m = \frac{qI}{kT}$$

whereas in strong inversion $$g_m = \frac{I}{V_g - V_T}$$

where Vg is the gate bias voltage relative to source, and VT is the threshold voltage of the transistor. The convention is adopted that a positive sign for Vg–VT corresponds to an increasing current through the transistor. Because strong inversion is defined to be the region for which Vg–VT>kT/q, for a given current I, the noise in weak inversion will always be lower than that in strong inversion. If the input voltage is much less than the threshold voltage, the amplifier will be too slow. If the input voltage is much greater than the threshold voltage, the noise and power dissipation will be too great. Thus, the optimum bias condition for these transistors is for their gate-to-source voltage to be within a few hundred millivolts of their threshold voltage. The absolute limits will depend on factors such as the process, threshold voltage, oxide thickness, etc., as will be appreciated by those of ordinary skill in the art.

Because the load transistor 16 does not have a signal connected to its gate, the noise contributed by it is by way of its current. This current noise is only weakly dependent on whether the load transistor 16 is operated above or below threshold.

Figure 2:
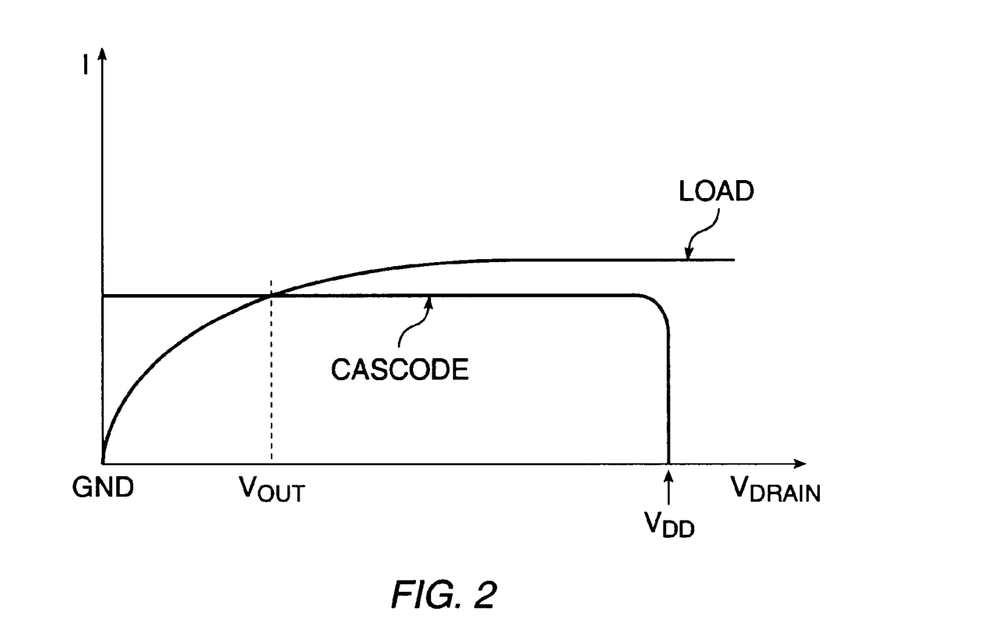
FIG. 2 is a graph showing a typical load-line plot of the currents through the cascode and load transistors of the sense amplifier of FIG. 1.

In order to achieve good current matching, high gain, and a compressive input-output characteristic, the load transistor 16 is operated in strong inversion. The input-output characteristic can be inferred from FIG. 2, which is a typical load-line plot of the currents through the cascode transistor 14 and load transistor 16, as will be readily understood by those of ordinary skill in the art.

The current through the drain of cascode transistor 14 will, of course, be a sensitive function of the voltage at the input line 18, provided the bias on the cascode line 22 is sufficient to bias the drain of the input transistor 12 (source of the cascode transistor 14) into saturation. As may be seen from FIG. 2, the amplifier 10 will have maximum gain when the output is near the positive rail, which it will be after the amplifier has been balanced (output connected to the input by the balance transistor 30), and the amplifier is sensing a very small charge. It is for this reason that P-Channel input and cascode transistors 12 and 14 are used with a NPN photo-transistor array.

From the above discussion, those of ordinary skill in the art will recognize that the present invention may also be used with a PNP photo-transistor array. The difference between such an amplifier and the one depicted in FIG. 1 is that the input and cascode transistors will comprise N-Channel MOS transistors, and the load transistor will comprise a P-Channel MOS transistor.

One of the important aspects of the present invention is the ability to integrate a plurality of sense amplifiers of the present invention into a photo-transistor imaging array such that each sense amplifier occupies only the width of a single pixel in the array.

Figure 3:
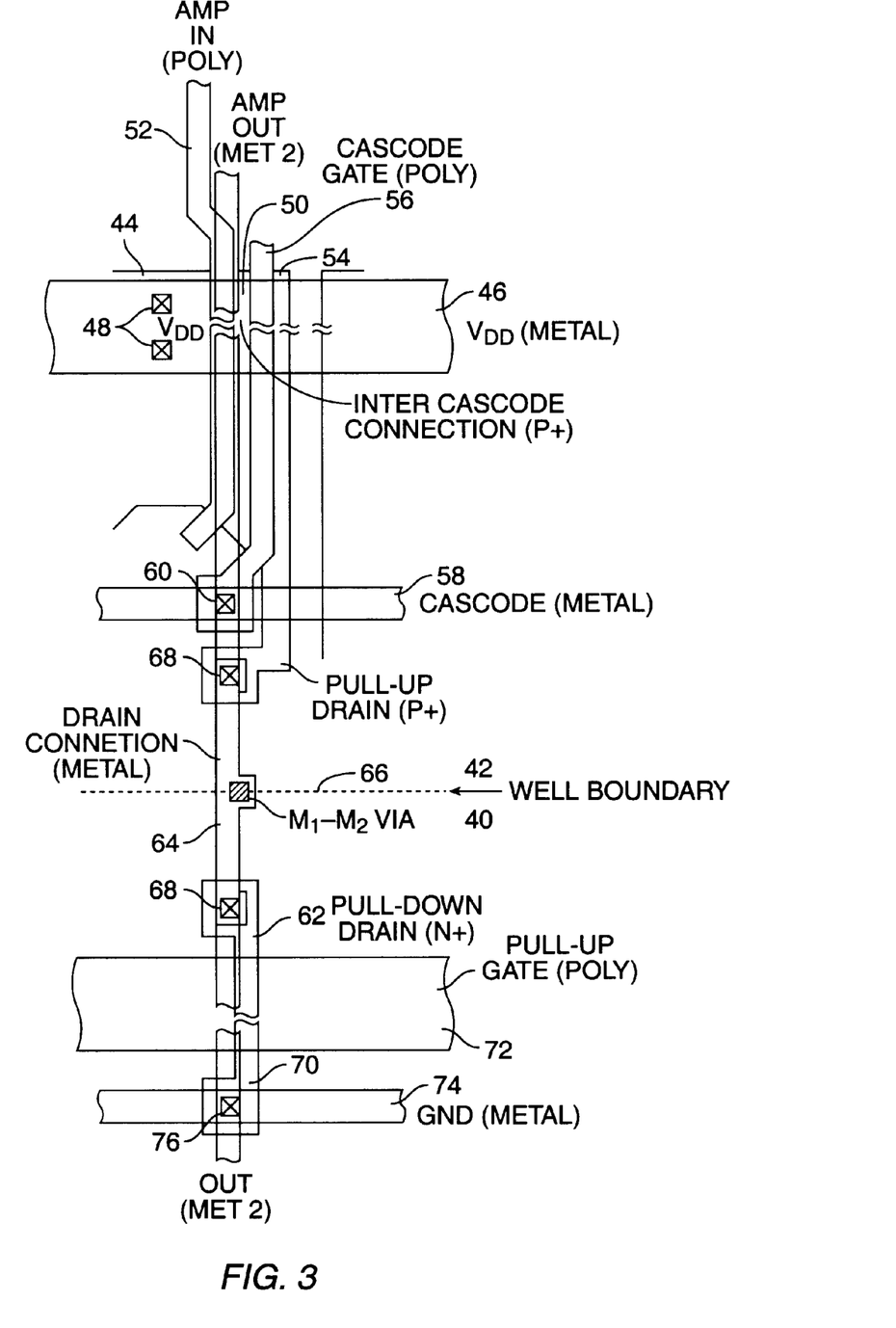
FIG. 3 is a top view of a typical layout of the sense amplifier of FIG. 1.

FIG. 3 is a top view of a typical layout of the sense amplifier of FIG. 1 in which the layout aspect of the present invention is illustrated. Referring now to both FIGS. 1 and 3, the amplifier 10 is fabricated in and on a semiconductor substrate shown generally by reference numeral 40. An n-type well region 42 is disposed in substrate 40 in which the P-Channel devices will be formed. A first doped region 44 in the well 42 forms the source of the P-Channel MOS input transistor 12. First doped region 44 is connected to metal line 46 through contacts 48. Metal line 46 forms the Vdd rail 20 in the schematic diagram of FIG. 1. A second doped region 50 in well 42 is spaced apart from first doped region 44 forms the common connection of the both the drain of P-Channel MOS input transistor 12 and the source of P-Channel cascode transistor 14 of FIG. 1. A polysilicon line 52, forming the gate of P-Channel MOS input transistor 12, overlies the space (not shown) between first and second doped regions 44 and 50. This space comprises the channel of input transistor 12.

A third doped region 54 in well 42 forms the drain of cascode transistor 14 of FIG. 1. A polysilicon line 56, forming the gate of P-Channel MOS cascode transistor 14, overlies the space (not shown) between second and third doped regions 50 and 54. This space comprises the channel of cascode transistor 14. A metal line 58 is connected to polysilicon line 56 via contact 60.

A fourth doped region 62 in a region of the substrate 40 outside of well 42 forms the drain of N-Channel MOS output transistor 16 of FIG. 1. A metal line 64 bridges the boundary of well 42 (shown as dashed line 66 and connects third doped region 54 to fourth doped region 62 via contacts 68 as is well known in the art. A fifth doped region 70 in substrate 40 is spaced apart from third doped region 54 and forms the source of N-Channel MOS output transistor 26 of FIG. 1. The space between fourth and fifth doped regions 54 and 70 forms the channel of N-Channel MOS output transistor 26 and polysilicon line 72 forms the gate of N-Channel MOS output transistor 26. Metal line 74 forms the ground supply voltage rail and is connected to fifth doped region 70 via contact 76.

Those of ordinary skill in the art will note that breaks are indicated in the figure for the first, second, and third doped regions 44, 50, and 54, and for the polysilicon lines 52 and 56, indicating that input and cascode transistors which these elements comprise are longer than is shown in the drawing figure. This is in accordance with a feature of the invention discussed previously.

In the embodiment shown in FIG. 3, well 42 is an n-type region in a p-type substrate, containing p-type doped regions for the sources and drains of the P-Channel input and cascode transistors. The source and drain regions for the N-Channel output transistor are n-type regions. Those of ordinary skill in the art will readily recognize that the polarity may be reversed, i.e., a p-type well containing n-type doped regions for sources and drains of N-Channel input and cascode transistors could be disposed in a n-type substrate containing p-type doped regions for the source and drain of a P-Channel output transistor, without departing from the scope or spirit of the present invention. Likewise, in an n-well process, the input and cascode transistors can be n-channel, disposed in the substrate, and the load transistor can be p-channel, located in the well.

As may be seen from an examination of FIG. 3, the sense amplifier of the present invention may be formed in an extremely narrow area of the substrate 40 and in fact may be the same width as one of the pixel columns in a photo-transistor sensor array. The Vdd rail comprising metal line 46, cascode metal line comprising metal line 58, and polysilicon line 72, forming the gate of N-Channel MOS output transistor 26 are all oriented horizontally in FIG. 3 and those of ordinary skill in the art will readily recognize how a plurality of sense amplifiers in the present invention may be disposed side-by-side, all making common connections to metal lines 46 for Vdd, 74 for ground, and 58 for the cascode bias voltage. Polysilicon line 72 will form the gates for all sense amplifier load transistors in the array. Polysilicon line 52 forming the input to the sense amplifier, and metal line 62 forming the output of the sense amplifier are shown running in the vertical direction of FIG. 3 for ease of making input and output connections to and from the sense amplifier.

Figure 4:
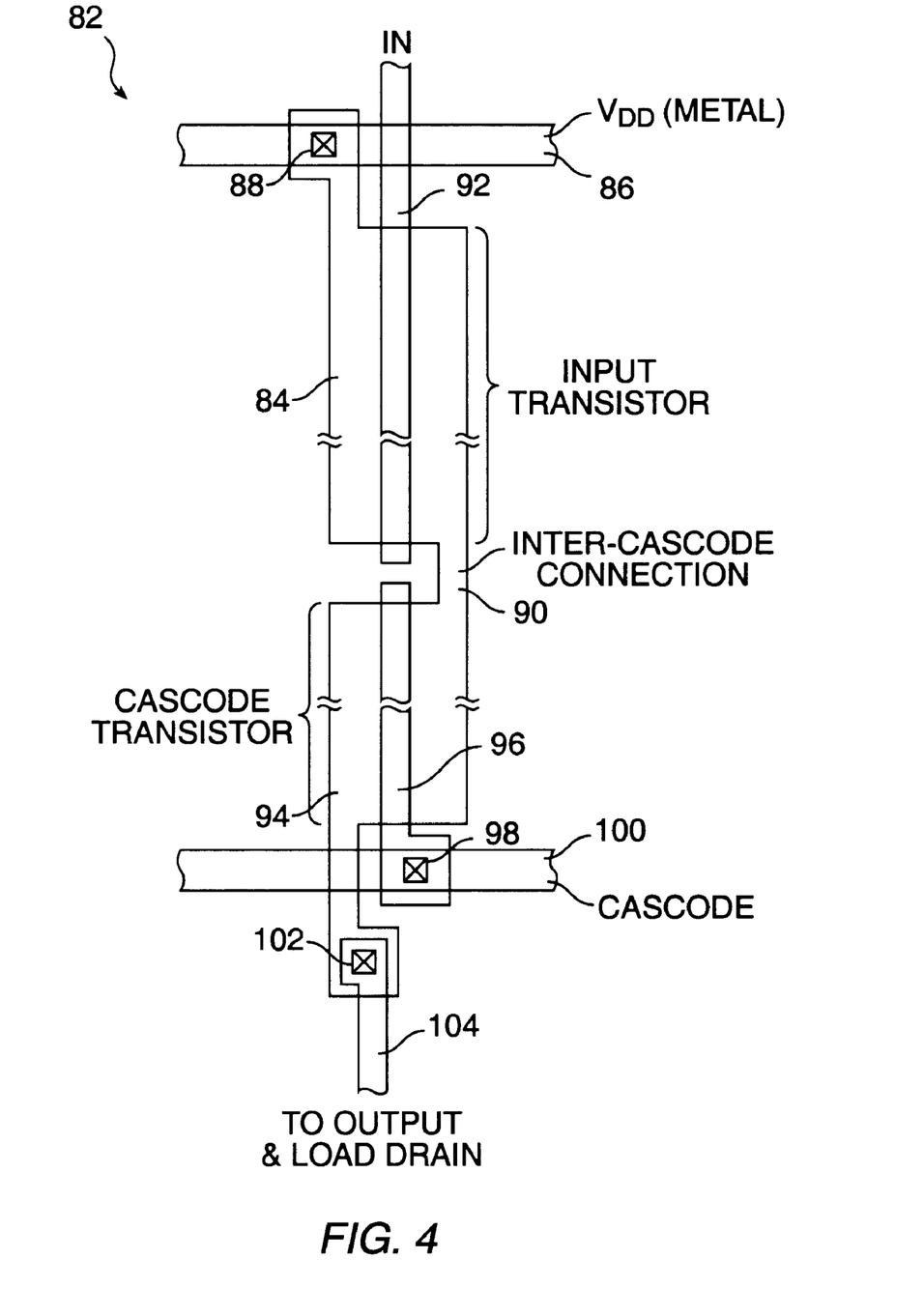
FIG. 4 is a top view of an alternate typical layout of the portion of the sense amplifier of FIG. 1 including the input transistor and the cascode transistor.
Figure 5:
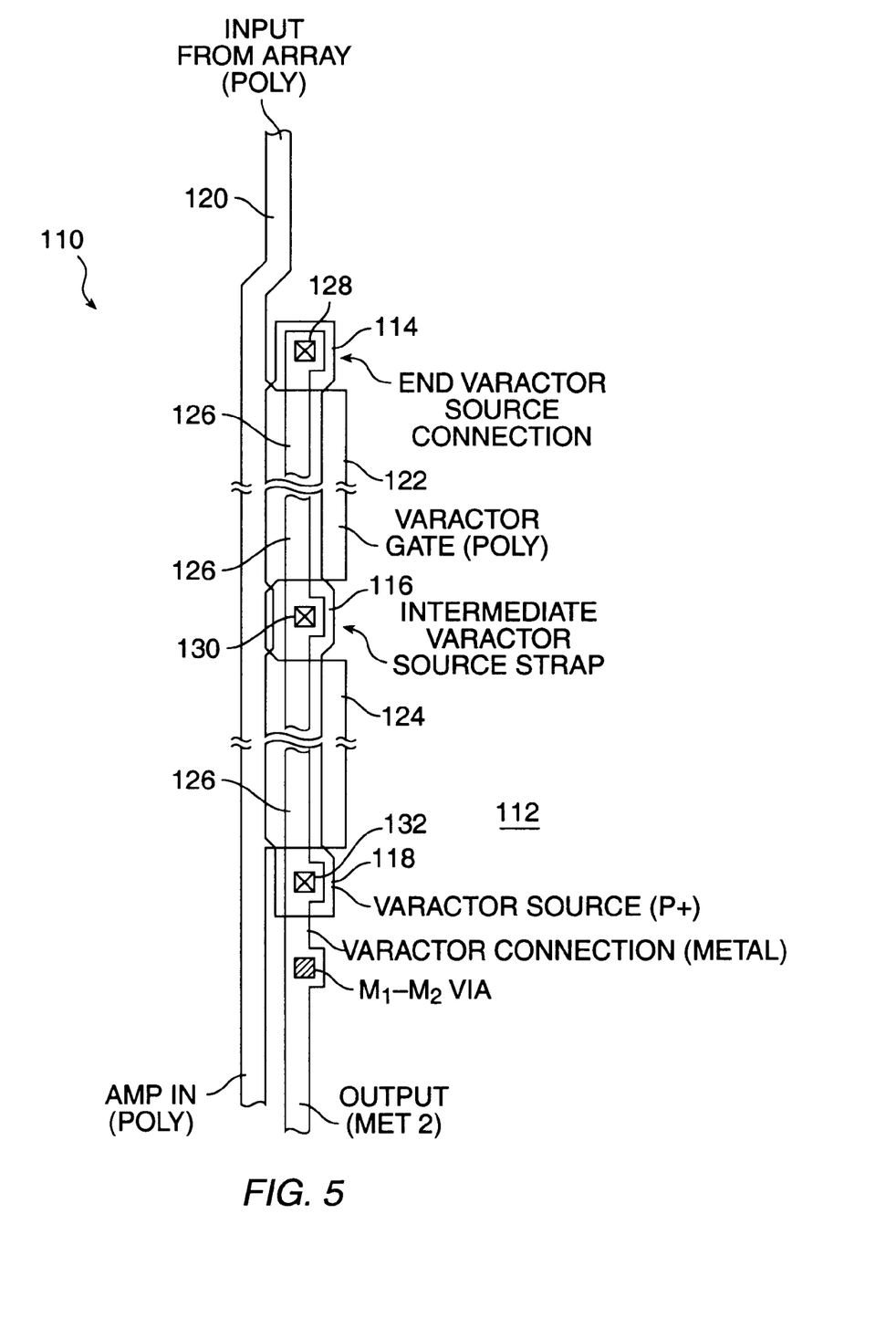
FIG. 5 is a top view of a layout of a varactor element which may be used in combination with the sense amplifier of the present invention.

FIG. 4 is a top view of an alternate typical layout of the portion of the sense amplifier of FIG. 1 which includes the input transistor and the cascode transistor. The remainder of the layout of the sense amplifier of this embodiment (not shown) including the load transistor will be identical to the load transistor portion of the sense amplifier shown in FIG. 3. Referring now to FIG. 4, a well 82 includes a first doped region 84 (shown vertically-oriented in the drawing) which comprises the source of input transistor 12 of FIG. 1. First doped region 84 is connected to metal line 86 supplying Vdd through contact 88. As with the embodiment of FIG. 4, when the amplifier of FIG. 5 is utilized in an array, metal line 86 will cross and be connected to the doped regions forming the sources of the input transistors of all amplifiers serving an array.

A second doped region 90 in well 82 is oriented parallel to first doped region 84, is spaced apart therefrom and is slightly offset therefrom. Second doped region 90 forms the drain of the input transistor 12 of FIG. 1 and the source of the cascode transistor 14 of FIG. 1. The space in well 82 in between first and second doped regions 84 and 90 forms the channel for the input transistor 12. A polysilicon line 92 overlies the channel, which is thus not shown in the figure, and forms the gate of input transistor 12.

A third doped region 94 in well 82 is oriented parallel to second doped region 84, is spaced apart therefrom and is slightly offset therefrom. Third doped region 94 lies below and on axis with first doped region 84. Third doped region 94 forms the drain of the cascode transistor 14 of FIG. 1. The space in well 82 in between second and third doped regions 90 and 94 forms the channel for the cascode transistor 14. A polysilicon line 96 overlies the channel of the cascode transistor, which is thus not shown in the figure, and forms the gate of cascode transistor 14. A contact 98 connects the polysilicon line 96, the gate of the cascode transistor, with a metal line 100 comprising the cascode voltage bias line. As with the embodiment of FIG. 4, when the amplifier of FIG. 5 is utilized in an array, metal line 100 will cross and be connected to the polysilicon lines forming the gates of the cascode transistors of all amplifiers serving an array.

A contact 102 connects the bottom of third doped region 94 to metal line 104. Those of ordinary skill in the art will recognize that metal line 104 is equivalent to metal line 62 of FIG. 3 and connects the drain of the P-Channel cascode transistor in the well to the drain of the N-Channel output transistor in the substrate, as well as forming the output node of the sense amplifier of the present invention.

As indicated in FIG. 4 by the breaks shown in first and second doped regions 84 and 90 and polysilicon line 92, the input transistor may have a length greater than that shown in the figure. In addition, as indicated in FIG. 4 by the breaks shown in second and third doped regions 90 and 94 and polysilicon line 96, the cascode transistor also may have a length greater than that shown in the figure. This is in accordance with an aspect of the present invention which has been previously discussed herein.

FIG. 5 is a top view of a varactor device 110 which may be employed as device 32 in FIG. 1 with the sense amplifier of FIGS. 3, and 4. Varactor 110 may be placed between the array and sense amplifier in a typical application, and the following description assumes such placement in an integrated circuit containing an array, varactors, and sense amplifiers as described herein, although such placement is not necessary for practice of the present invention. FIG. 5 illustrates an N-Channel varactor device, although those of ordinary skill in the art will readily be able to fabricate a P-Channel varactor device as well.

Referring now to FIG. 5, a semiconductor substrate 112 includes a first doped region 114 forming an end varactor source strip. A second doped region 116 is spaced apart from the first doped region and forms an intermediate source strip. A third doped region 118 is spaced apart from second doped region 116 and forms an end varactor source strip. A polysilicon line 120, carrying the output signal from the array column with which the varactor 110 is associated, runs past doped regions 114, 116, and 118 and includes laterally-extending fingers 122 and 124 which extend over channel regions (not shown) defined between doped regions 114 and 116 and 116 and 118, respectively. These laterally-extending fingers 122 and 124 form the gate of the varactor. Vertically-extending metal line 126 connects the first, second, and third doped regions 114, 116, and 118 together through contacts 128, 130, and 132, respectively. Metal line 126 will connect to metal line 64 of FIG. 3 or metal line 104 of FIG. 5 (the output node of the sense amplifier of the present invention), and polysilicon line 120 will connect with polysilicon line 52 of FIG. 3 or polysilicon line 92 of FIG. 4 (the input node of the sense amplifier of the present invention), thus placing varactor 110 across the input and output of the sense amplifier.

As previously mentioned, the sense amplifier of the present invention is particularly useful in an application wherein a plurality of such sense amplifiers are employed on an integrated circuit along with a photosensing array, such as the single-transistor photosensing array disclosed and claimed in any one of U.S. Pat. Nos. 5,097,305, 5,260,592, and 5,324,958. When used with such an array, a single sense amplifier can be layed out to occupy a width on the semiconductor substrate equal to the width of a single column of photosensing transistor elements. This allows fabrication of a compact and efficient array and sensing combination having a wide dynamic range.

Figure 6:
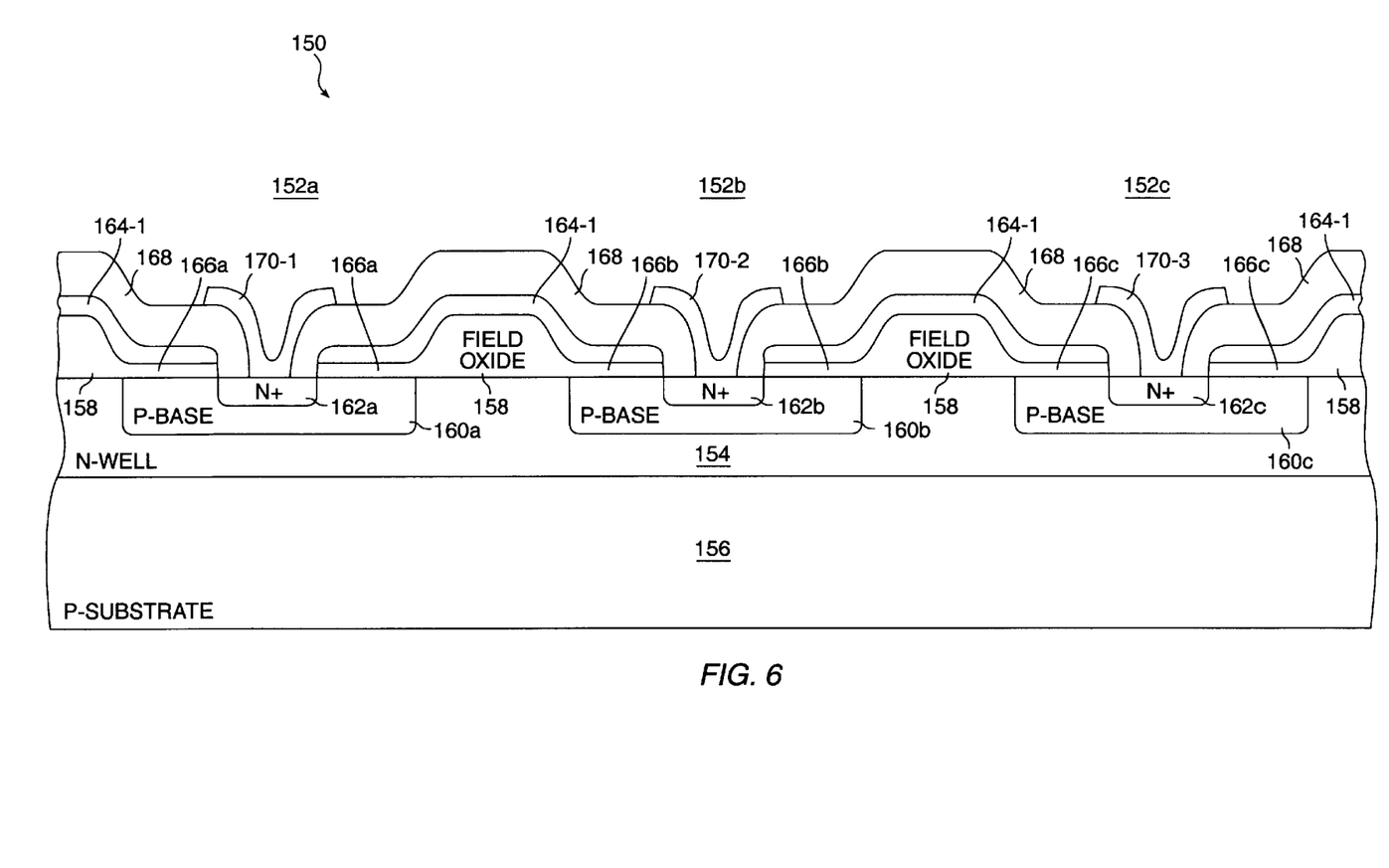
FIG. 6 is a cross-sectional view of a layout of a portion of an array of single transistor integrating photosensors according to an aspect of the invention implemented in an N-well CMOS process taken along an axis parallel to one row thereof in a position which bisects a row-select line of the array.

FIG. 6 is a cross-sectional view of a layout of a portion of an array of single transistor integrating photosensors according to an aspect of the invention implemented in an N-well CMOS process taken along an axis parallel to one row thereof in a position which bisects a row-select line of the array. The cross-section of FIG. 6 bisects a row-select line of the array. The portion of the array shown in FIG. 6 three columns of one-transistor integrating photosensors.

Those of ordinary skill in the art will readily understand that this embodiment is merely illustrative and that practical arrays fabricated according to the principles of the present invention are likely to be substantially larger. The practical limit on array size is largely a function of CMOS processing limitations.

In FIG. 6, array 150 is shown to include an exemplary row of integrating photosensors including photosensors 152a, 152b, and 152c, fabricated in n-well 154, formed in p-type substrate 156 using conventional processing techniques. Integrating photosensors 152a, 152b, and 152c may be separated by conventionally formed field oxide regions 158, as is well known in the art. Those of ordinary skill in the art will immediately recognize that region 154 could itself be an n-type semiconductor substrate instead of being an n-well in a p-type semiconductor substrate. This is may be seen in FIG. 6 if region 156 is ignored.

P-type base regions 160a, 160b, and 160c, formed in regions of n-well 154 between birds beaks or in apertures etched in a uniformly grown field oxide 158, comprise the base regions of the NPN bipolar transistors comprising integrating photosensors 152a, 152b, and 152c, respectively. The minimum inter-pixel distance is set by the inter-base spacing. The base doping is chosen such that the base surface concentration is larger than the well-surface concentration but light enough so that the base-emitter reverse leakage characteristic is not degraded by incipient breakdown at the reverse bias voltage used for integrating the photo-generated charge.

N-region 154 forms the common collectors for bipolar transistor integrating photosensors 152a, 152b, and 152c, and N+emitter regions 162a, 162b, and 162c, form the emitters of bipolar transistor integrating photosensors 152a, 152b, and 152c, respectively. Conductive row-select line 164-1 comprises a line of conductive material, such as polysilicon, metal silicide or any other conductive layer which may be employed as a gate in a CMOS process. Row-select line 164-1 line runs the length of the row over field oxide regions 158 and gate oxide regions 166a, 166b, and 166c. Deposited oxide layer 172 covers row-select line 164-1. Column sense lines 170-1, 170-2, and 170-3 are shown in end view disposed over deposited oxide layer 168 and contacting emitters 162a, 162b, and 162c of integrating photosensors 152a, 1 52b, and 152c, respectively.

Examination of FIG. 6 reveals that the emitter regions are substantially self aligned to the edges of the polysilicon layers forming row-select lines 164-1. This is a result of the fact that the emitter regions are created during the self-aligned gate source/drain implant step simultaneously with the sources and drains of the MOS transistors on the integrated circuit. Those of ordinary skill in the art will realize that this provides the advantage of minimizing the emitter-to-row-select-line capacitance in the integrating photosensors.

Figure 7:
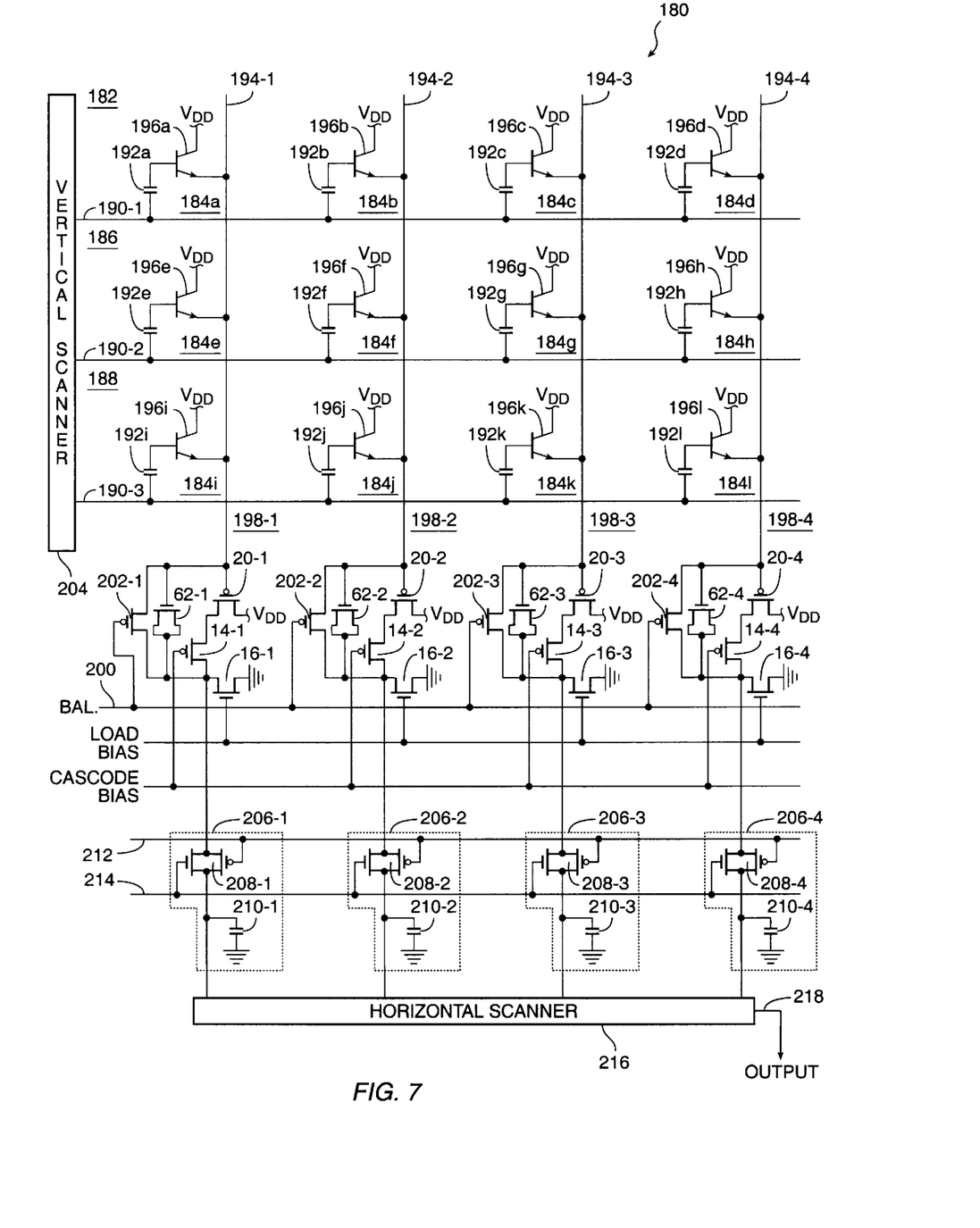
FIG. 7 is a block diagram of an imaging array comprising bipolar transistor integrating photosensors according to a presently preferred embodiment of the invention.

FIG. 7 is a block diagram of an imaging array 180 comprising bipolar transistor integrating photosensors and a plurality of narrow profile sense amplifiers according to a presently preferred embodiment of the invention. The array 180 of FIG. 7 is shown including twelve integrating photosensors according to the present invention arranged into three rows and four columns. Those of ordinary skill in the art will readily observe that the embodiment shown in FIG. 7 is illustrative and not limiting in nature, and that an array of any size is contemplated by the present invention, limited only by the inherent density and chip size limitations of CMOS technology.

Row 182 of array 180 includes photosensors 184a–184d. Row 186 of array 180 includes photosensors 184e–184h. Row 188 of array 180 includes photosensors 184i–184l. In FIG. 7, photosensors 184a–184l are illustrated as bipolar integrating photosensors. Those of ordinary skill in the art will recognize that other integrating photosensor elements may be used in place of the integrating photosensor element shown in FIG. 7.

First row-select line 190-1 is connected to one plate of capacitors 192a–192d. Second row-select line 190-2 is connected to one plate of capacitors 192e–192h. Third row-select line 190-3 is connected to one plate of capacitors 192i–192l. First sense line 194-1 is connected to the emitters of phototransistors 196a, 196e, and 196i of the first column in the array 180. Second sense line 194-2 is connected to the emitters of phototransistors 196b, 196f, and 196j of the second column in the array 180. Third sense line 194-3 is connected to the emitters of phototransistors 196c, 196g, and 196k of the third column in the array 180. Fourth sense line 194-4 is connected to the emitters of phototransistors 196d, 196h, and 196l of the fourth column in the array 180.

First sense amplifier 198-1 is connected to first sense line 194-1. Second sense amplifier 198-2 is connected to second sense line 194-2. Third sense amplifier 198-3 is connected to third sense line 194-3. Fourth sense amplifier 198-4 is connected to fourth sense line 194-4. Sense amplifiers 198-1 through 198-4 are the sense amplifiers disclosed herein. As will be apparent from the discussion accompanying FIG. 2, a row of pixels from array 180 may be read by pulsing balance line 200, driving the gates of balance transistors 202-1 through 202-4, followed by bringing the desired one of row lines 190-1 through 190-3 to a high logic level.

In a presently preferred embodiment, a vertical scanning circuit 204 is adapted to select only one of the row select lines 190 at any given time. Circuits for performing this function are well known in the art.

According to a presently-preferred embodiment of the invention, the outputs of all of the sense amplifiers are captured by sample/hold circuits 206-1 through 206-4 so that they may be scanned out while the sense amplifiers are sensing charge from the next row of pixels. As presently preferred, sample/hold circuits 206-1 through 206-4 may comprise pass gates 208-1 through 208-4 and capacitors 210-1 through 210-4. The N-Channel and P-Channel MOS transistors comprising the pass gates are conventionally driven by complementary signals SAMPLE and SAMPLE! on lines 212 and 214 as is well known in the art. The advantage of employing the sample/hold circuits is that the sense amplifiers have an entire line time to settle, and the residual charge on each row of pixels is much less than if the amplifier outputs were scanned directly.

As those of ordinary skill in the art will readily appreciate, the timing of the operation of the array of FIG. 7 is straightforward. Vertical scanner 204 selects one of the rows of pixels. After the settling time for the sensing of charge in the selected row of pixels has passed, a sampling pulse is used to activate the pass gates 208-1 through 208-4 for a time long enough to charge capacitors 210-1 through 210-4 with the voltage outputs of the sense amplifiers 198-1 through 198-4. Horizontal scanner 216 is then used to scan the output values out of the array. Vertical scanner 204 selects another row and the data acquisition and scanning process repeats until the pixel data for the entire array or selected portion thereof has been read out by horizontal scanner 216.

In a true serial scanned imager, horizontal scanning circuitry 216 is adapted to select the signal from the output of one of sample/hold circuits 206-1 through 206-4 at a given time, to form the output 218 of the array. Exemplary scanning circuits suitable for use as vertical and horizontal scanning circuits 204 and 216 are described in *Analog VLSI and Neural Systems*, by Carver A. Mead, Addison Wesley Publishing Co., 1989, at pp. 263–267. If parallel outputs are desired, all amplifier outputs can be used directly, or subsets can be sequentially selected by horizontal scanning circuit 216.

Figure 8:
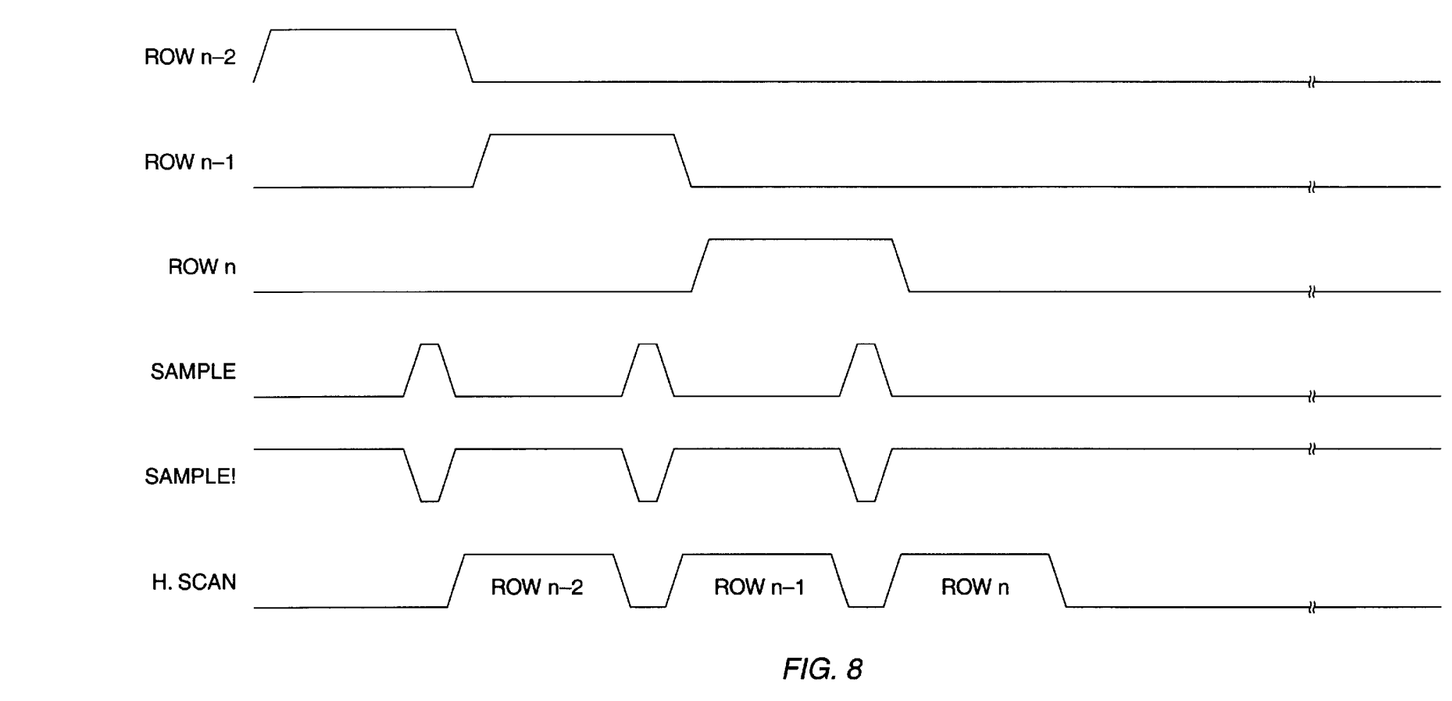
FIG. 8 is a timing diagram showing a typical timing sequence for the signals to row lines, the vertical scanner, the SAMPLE line, the SAMPLE! line, and horizontal scanner during three illustrative row scan cycles necessary for the operation of a typical array like the one of FIG. 7.

FIG. 8 is a timing diagram showing a typical timing sequence for the signals to row-select lines of the vertical scanner 204, SAMPLE line 212 and SAMPLE! line 214, and horizontal scanner 216 during three illustrative row scan cycles necessary for the operation of a typical array like the one of FIG. 7. Circuitry for providing the signals shown in FIG. 8 is conventional and design of such circuitry is well within the level of ordinary skill in the art. From FIG. 8, it may be seen that the signals driving the row-select lines may come from a serial shift register or a typical one of N decoder circuit. The SAMPLE and SAMPLE! signals are easily derived from the row-select line drive signals by, for example, a monostable multivibrator circuit. Note that the horizontal scanner control signal (H. Scan) is shown as a scan period during which either serial scanning, such as by analog multiplexer, or parallel scanning, such as by enabling pass gates, may take place during the period when the H. Scan signal is high. Selection of serial or parallel scanning is a matter of design choice.

Figure 9:
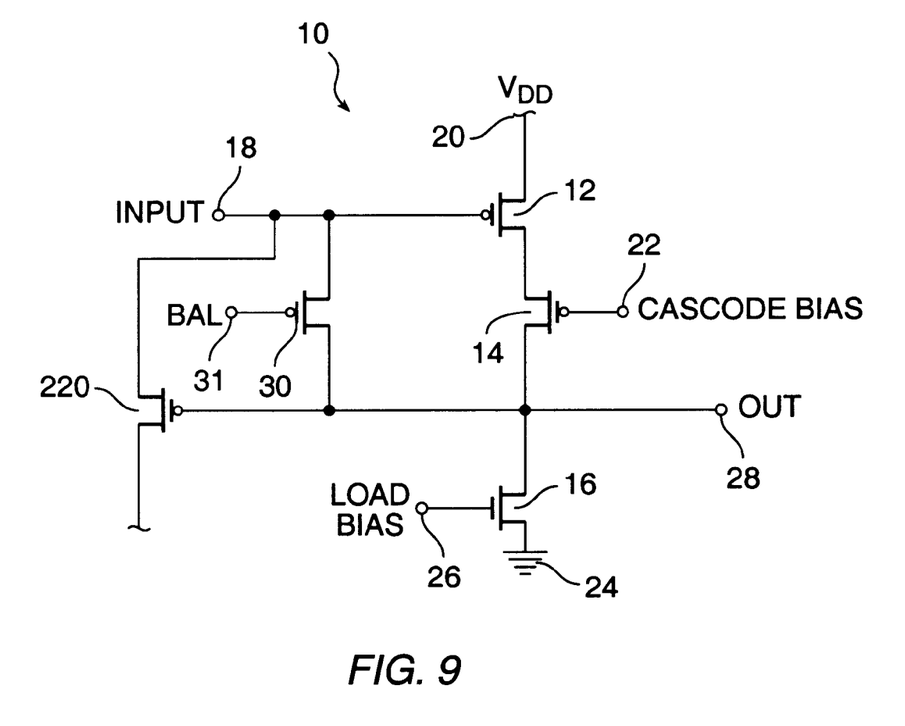
FIG. 9 is a schematic diagram of an alternate embodiment of the sense amplifier of the present invention useful with arrays which produce a current output.

It is well known in the art that a pixel outputting a current instead of a charge may be employed in an imaging array. The sense amplifier according to the present invention may be used with such an array by substituting a current feedback element for the varactor 32 of FIG. 1. For example, FIG. 9 is a schematic diagram of a sense amplifier according to the present invention similar to that shown in FIG. 1. The elements of FIG. 9 which are present in FIG. 1 are given the same reference numerals as those corresponding elements in FIG. 1 and operate in the same manner as their counterparts in FIG. 1. For brevity, the disclosure of the operation of these elements will not be repeated.

In addition to the elements of FIG. 9 which are common with the sense amplifier of FIG. 1, a P-Channel transistor feedback element 220 is shown with its source connected to input node 18, its gate connected to output node 28, and its drain connected to ground 24. The sense amplifier configured in this manner is appropriate for sensing positive currents on input node 18. Similarly, an N-Channel transistor would be employed to sense negative currents in an embodiment of the sense amplifier utilizing N-Channel input and cascode transistors and a P-Channel output transistor. The effects on circuit designs of switching polarity in MOS devices are well known in the art.

While embodiments and applications of this invention have been shown and described, it would be apparent to those skilled in the art that many more modifications than mentioned above are possible without departing from the inventive concepts disclosed herein. The invention, therefore, is not to be restricted except in the spirit of the appended claims.

What is claimed is:

1. An integrating imaging array disposed on a single piece of semiconductor substrate material, including:

a plurality of integrating photosensors arranged in an array of rows and columns, each of said photosensors comprising a bipolar phototransistor having a collector connected to a fixed voltage source, an emitter connected to a sense node, and a base connected to one end of a capacitor, the other end of said capacitor connected to a select node, each of said integrating photosensors occupying a column width;

a plurality of row lines, each one of said row lines associated with a different row in said array; each of said row lines connected to the select nodes of all of the integrating photosensors associated with its row; and a plurality of sense lines, each one of said sense lines associated with a different column in said array, each of said sense lines connected the sense nodes of all of the integrating photosensors associated with its row;

a plurality of inverting sense amplifiers, each one of said inverting sense amplifiers associated with a different column of said array, each of said inverting sense amplifiers having an input and an output, the input of each of said inverting sense amplifiers connected to the one of said sense lines associated with its column, each of said inverting sense amplifiers fitting within said column width;

means for placing a signal on a selected one of said row lines to activate the select nodes of the integrating photosensors associated with said selected one of said row lines;

a plurality of sample/hold circuits, each one of said sample/hold circuits associated with a different column of said array, each of said sample/hold circuits having a control input, a data input and a data output, the data input of each of said sample/hold circuits connected to the output of the one of said inverting sense amplifiers associated with its column;

means for selectively activating the control inputs of said sample/hold circuits, an input node; and wherein each of said inverting sense amplifiers comprises:
an input node;
an output node;
an input transistor having a gate connected to the input node, a source connected to a first supply voltage rail, and a drain;
a cascode transistor having a gate connected to a cascode node, a source connected to the drain of the input transistor, and a drain connected to the output node; and
a load transistor having a gate connected to a bias node, a drain connected to the output node, and a source connected to a second supply voltage rail.
wherein the w/l ratio of the input transistor and the cascode transistor is much greater than the w/l ratio of the load transistor.

2. The integrated imaging array of claim 1 wherein in each of said sense amplifiers the w/l ratio of the input transistor and the cascode transistor is at least 10 times greater than the wit ratio of the load transistor.

3. The integrated imaging array of claim 1 wherein in each of said inverting sense amplifiers the gates of the cascode transistor and the load transistor are biased such that the input transistor and the cascode transistor are operated near their threshold and the load transistor is operated above threshold.

4. The integrated imaging array of claim 1, wherein each of said sense amplifiers further includes a varactor element connected between its input and its output.

5. The integrated imaging array of claim 4 wherein said varactor element of each of said sense amplifiers comprises a MOS transistor having its gate connected to said input of said sense amplifier and its source and drain connected to said output of said sense amplifier.

6. The integrated imaging array of claim 4 wherein said varactor element of each of said sense amplifiers comprises a MOS transistor having its gate connected to said output of said sense amplifier and its source and drain connected to said input of said sense amplifier.

7. The integrated imaging array of claim 1, wherein each of said sense amplifiers further includes means for selectively connecting its output to its input.

8. The integrated imaging array of claim 7 wherein said means for selectively connecting comprises a MOS transistor connected between said input node and said output node, said MOS transistor having its gate connected to a balance input node.

9. The integrated imaging array of claim 1, further including means for adapting said sense amplifier to a known state when none of said rows are selected.

10. The integrated imaging array of claim 1, further including:
means for serially selecting each of said rows in order; and
means for serially selecting the outputs of said sample/hold circuits when each of said rows has been selected.

* * * * *